United States Patent
Tsukihara et al.

(10) Patent No.: US 7,851,772 B2
(45) Date of Patent: Dec. 14, 2010

(54) ION IMPLANTATION APPARATUS AND ION IMPLANTATION METHOD

(75) Inventors: Mitsukuni Tsukihara, Saijo (JP); Takanori Yagita, Saijo (JP); Hiroshi Sogabe, Saijo (JP); Toshio Yumiyama, Saijo (JP); Mitsuaki Kabasawa, Saijo (JP)

(73) Assignee: Sen Corporation an Shi and Axcelis Company, Tokyo (JP)

( * ) Notice: Subject to any disclaimer, the term of this patent is extended or adjusted under 35 U.S.C. 154(b) by 288 days.

(21) Appl. No.: 12/100,666

(22) Filed: Apr. 10, 2008

(65) Prior Publication Data

US 2008/0251713 A1    Oct. 16, 2008

(30) Foreign Application Priority Data

Apr. 10, 2007    (JP) .............................. 2007-103194

(51) Int. Cl.
*H01J 37/317*    (2006.01)
*H01J 37/28*     (2006.01)
*G21K 1/08*      (2006.01)

(52) U.S. Cl. .............................. 250/492.21; 250/492.3; 250/396 R; 250/396 ML; 250/281; 250/282

(58) Field of Classification Search ............ 250/492.21, 250/492.3, 396 R, 396 ML, 281, 282
See application file for complete search history.

(56) References Cited

U.S. PATENT DOCUMENTS

| | | | |
|---|---|---|---|
| 4,980,562 A | 12/1990 | Berrian et al. | |
| 5,751,002 A * | 5/1998 | Ogata et al. | 250/492.21 |
| 7,005,657 B1 | 2/2006 | Low et al. | |
| 7,429,743 B2 * | 9/2008 | Kabasawa et al. | 250/492.21 |
| 2008/0251734 A1 * | 10/2008 | Tsukihara et al. | 250/396 ML |
| 2008/0251737 A1 * | 10/2008 | Tsukihara et al. | 250/492.21 |
| 2009/0206270 A1 * | 8/2009 | Glayish et al. | 250/396 ML |

FOREIGN PATENT DOCUMENTS

| | | |
|---|---|---|
| GB | 2 098 793 A | 11/1982 |
| JP | 11-345586 A | 12/1999 |
| JP | 2006-156259 A | 6/2006 |

* cited by examiner

*Primary Examiner*—Nikita Wells
(74) *Attorney, Agent, or Firm*—Arent Fox LLP

(57) ABSTRACT

An ion implantation apparatus according to the invention includes a park electrode as a deflecting apparatus arranged at a section of a beam line from an outlet of a mass analysis magnet apparatus to a front side of a mass analysis slit for deflecting an ion beam in a predetermined direction of being deviated from a beam trajectory line by an operation of an electric field. When the ion beam does not satisfy a desired condition, a park voltage is applied to the park electrode, thereby, the ion beam is brought into an evacuated state by being deflected from the beam trajectory line. As a result, the ion beam cannot pass through the mass analysis slit, and therefore, the ion beam which does not arrive at a wafer to prevent the ion beam which does not satisfy the condition from being irradiated to the wafer.

10 Claims, 8 Drawing Sheets

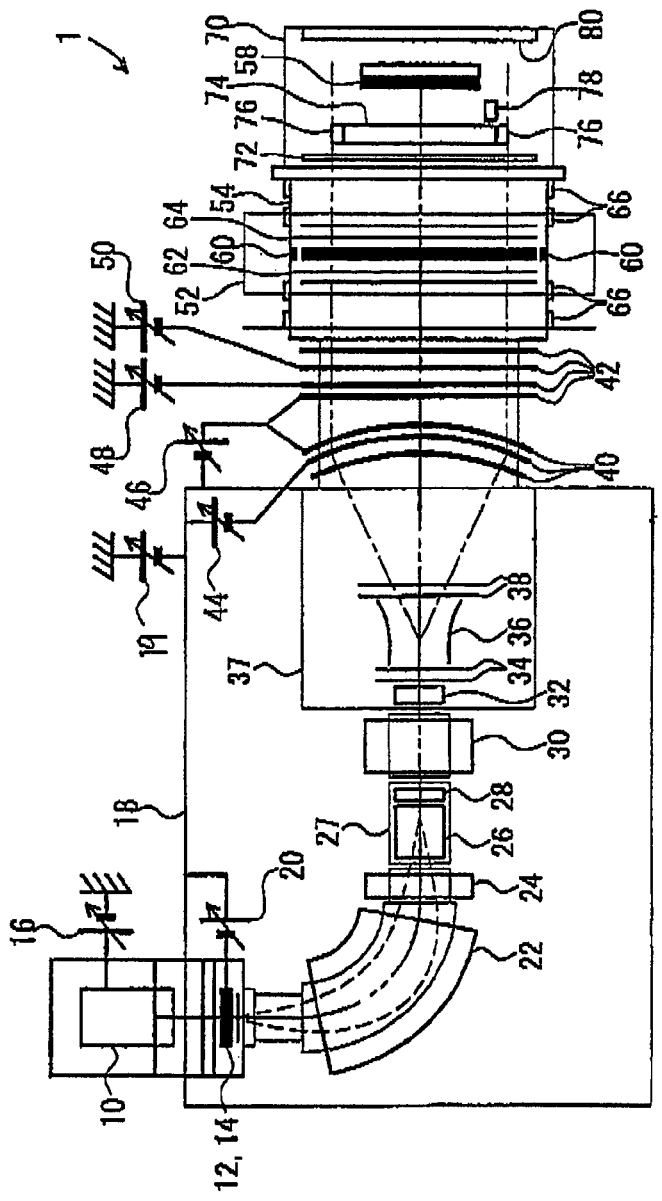
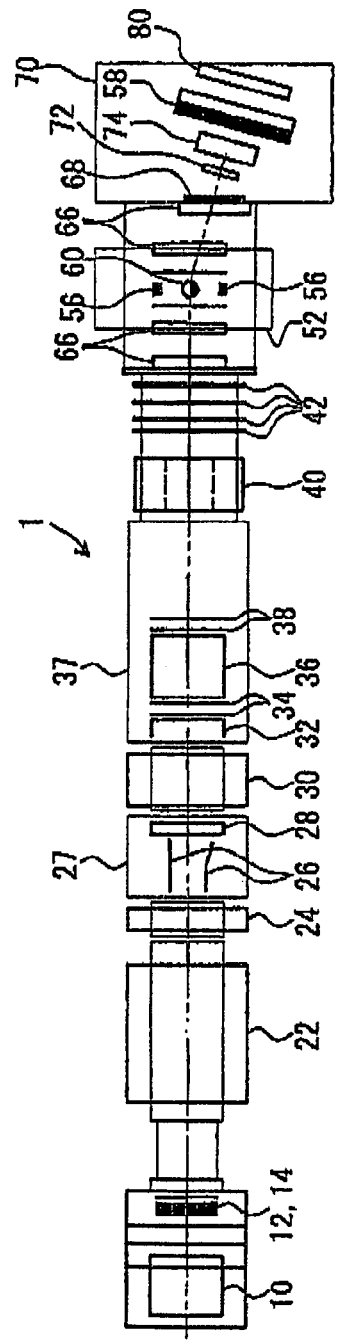
FIG. 2A
FIG. 2B

ION IMPLANTATION APPARATUS AND ION IMPLANTATION METHOD

This application is based upon and claims the benefit of priority from Japanese patent application No. 2007-103194, filed on Apr. 10, 2007, the disclosure of which is incorporated herein in its entirety by reference.

FIELD OF THE INVENTION

The present invention relates to an ion implantation apparatus, particularly relates to an ion implantation apparatus and an ion implantation method having a mechanism of extracting an ion beam comprising ions having a desired mass by a mass analysis magnet apparatus, thereafter, evacuating the ion beam by deflecting the ion beam from a beam trajectory line as necessary.

DESCRIPTION OF THE RELATED ART

As a method of forming a conductive layer of an n type or p type at a semiconductor wafer, there is used a so-called ion implantation technology for accelerating ions generated by an ion source to be implanted to a wafer as an ion beam. According to the ion implantation technology, an ion beam comprising ions having a desired mass is extracted by a mass analysis magnet apparatus, thereafter, the ion beam passing through a mass analysis slit is irradiated to a wafer (see Patent Reference 1: JP-A-2006-156259).

According to the ion implantation technology, a gas of a required ion species supplied to an ion source is ionized in a plasma chamber to thereby generate a plasma and an ion beam is extracted from the plasma for applying a predetermined voltage to an extracting electrode. However, even when the predetermined voltage is applied to the extracting electrode, rarely, a potential difference between a potential of the extracting electrode and a potential of the plasma chamber becomes equal to or smaller than a predetermined value by some cause, or generation of the plasma becomes unstable by various causes. When the phenomena are produced, there is a case in which an ion beam necessary for ion implantation cannot be provided since the ion beam is difficult to be extracted from the plasma, or even when the ion beam can be extracted from the plasma chamber, the ion beam cannot arrive at the wafer. The phenomenon is generally referred to as "discharge" or "short-circuit" or "instability of ion source" and an explanation will be given as follows by referring to these as "discharge phenomena".

When the discharge phenomenon is produced, it is difficult to ensure a uniformity of the ion beam and ensure a desired dose amount, and therefore, it is necessary to stop implanting ions to a wafer. Therefore, the ion implantation apparatus has been provided with measurement means for monitoring an ion beam at a portion in a region of irradiating the ion beam contiguous to the wafer. When it is detected by the measurement means that a desired ion beam cannot be provided, the ion beam is prevented from arriving at a wafer by considerably deflecting the ion beam from a beam trajectory line, or inserting a beam measurement member or a shutter to the beam line. As measurement means for monitoring, for example, a dose cup of an ion beam incident type is used.

There are high speed evacuating of instantaneously deflecting an ion beam and temporary evacuating of maintaining a evacuating state for a short period of time (referred to as beam park) in preventing the ion beam from arriving at the wafer by deflecting the ion beam from the beam trajectory line, that is, in evacuating the ion beam. In either of the cases, according to an ion implantation apparatus including, for example, a beam scanner in the ion beam implantation apparatus, high speed evacuating is carried out by deflecting the ion beam to one side considerably by exceeding a normal scanning range of the beam scanner, and temporary evacuating is carried out by maintaining the evacuating state for a short period of time.

FIG. 1 is a plane sectional view for explaining of evacuating an ion beam in a beam scanner. Although explained later, a beam scanner 200 scans to reciprocate an ion beam by electrostatic deflection by arranging a pair of scanning electrodes 220-1 and 220-2 at inside of a scanner housing 210. In FIG. 1, a scanning range of an ion beam B1 is indicated by a one-dotted chain line. When the ion beam is evacuated, the ion beam is deflected to be deviated considerably from the scanning range as shown by a broken line in FIG. 1 by changing an electric field generated by the scanning electrodes 220-1 and 220-2. Further, numeral 230 designates a parallel lens. The parallel lens 230 is for redeflecting the ion beam deflected to be provided with an angle in a horizontal direction relative to a center trajectory (indicated by a bold line in the drawing) of the ion beam before being incident on the beam scanner 200 to be in parallel with the center trajectory and a description will be given thereof later.

SUMMARY OF THE INVENTION

According to the above-described evacuating method, when an effective diameter of the ion beam is comparatively small, there is hardly an influence on ensuring an evacuating space or on a peripheral member. However, when the effective diameter of the ion beam is considerably large, it is necessary to constitute the scanning electrode of the beam scanner by a special shape such that the ion beam does not impinge on the scanning electrode in being evacuated. Further, it is difficult in view of design to ensure a location of evacuating the ion beam and an influence of irradiating a large diameter ion beam of sputtering the peripheral member or the like is considerable which is difficult to be dealt with. As an example of an ion beam having a large effective diameter, there is pointed out an ion beam having an elliptical or flat sectional shape particularly having a large diameter in a lateral direction.

On the other hand, in a case of an ion implantation apparatus of an ion beam fixed type which is not provided with a beam scanner, an ion beam in implanting ions is measured by a beam measurement apparatus on a rear side of a disk mounted with a wafer. In this case, when a bad condition of an ion beam of a discharge phenomenon or the like is detected by a beam measurement apparatus, the ion beam is evacuated by shutting off the ion beam by inserting an injector flag Faraday cup for measuring the ion beam to a beam line. According to the method, the injector flag Faraday cup is mechanically inserted to the beam line, and therefore, high speed evacuating and temporary evacuating in an extremely short time period of the ion beam is difficult to be realized.

The present invention has been carried out in view of such a problem and it is an object thereof to provide an ion implantation apparatus and an ion implantation method capable of realizing high speed evacuating and temporary evacuating of an ion beam regardless of a diameter or a sectional shape of the ion beam and without effecting an influence on a peripheral member.

An ion implantation apparatus according to an aspect of the present invention includes a beam line of implanting an ion by irradiating an ion beam extracted from an ion source to a wafer by way of a mass analysis magnet apparatus and a mass analysis slit arranged on a downstream side thereof. The ion implantation apparatus further comprises a deflecting apparatus arranged at a section of the beam line from an outlet of the mass analysis magnet apparatus to a front side of the mass analysis slit or a rear side of the mass analysis slit for deflecting the ion beam in a predetermined direction deviated from a beam trajectory line by an operation of an electric field. The deflecting apparatus is configured so as to carry out a high speed evacuating operation of an ion beam evacuation from the beam trajectory line, and a temporary evacuating operation which comprises the high speed evacuating operation and a maintaining operation of an evacuated state for a predetermined time period.

According to the ion implantation apparatus of the present invention, when the deflecting apparatus is brought into a deflecting operation state, the ion beam is brought into an evacuated state by being deflected from a beam trajectory line. Thereby, the ion beam does not advance to a downstream side of the mass analysis slit, and therefore, in a case in which the ion beam is evacuated when, for example, a discharge phenomenon is detected to be brought about, ions by a nonuniform ion beam by the discharge phenomenon can be prevented from being implanted to the wafer. Thereafter, in a case in which the ion beam is released from being evacuated when the discharge phenomenon is not brought about, ion implantation can be restarted.

The ion implantation apparatus according to the present invention further comprises a beam scanner for reciprocally scanning the ion beam periodically in a horizontal direction or a specific direction other than the horizontal direction on a downstream side of the mass analysis slit.

In the ion implantation apparatus according to the present invention, the ion beam may be converged in the horizontal direction at the mass analysis slit and diverged after passing through the mass analysis slit by the mass analysis magnet apparatus and, on a front side of the beam scanner, the ion beam may be diverged in the horizontal direction and converged in a vertical direction. In this case, the deflecting apparatus is arranged at a middle position, of an intermediate process of being directed from diverging to converging in the horizontal direction, or an intermediate process of being directed from converging to diverging on the beam trajectory line.

In the ion implantation apparatus according to the present invention, it is desirable that the deflecting apparatus includes a pair of deflecting electrodes arranged so as to oppose to each other by interposing the ion beam and extended in a direction of advancing the ion beam, and that one of the pair of deflecting electrodes is bent in a direction of being separated from other of the deflecting electrodes in the mid-course of the advancing direction of the ion beam, and the ion beam is deflected in the direction of being bent. In this case, it is desirable that the pair of deflecting electrodes and the mass analysis slit are contained in a housing and an ion beam receiving member comprises a material on which the ion beam deflected for evacuating impinges and by which sputtering is less generated by impacting the ion beam is provided at a face on an upstream side of the mass analysis slit and an inner wall of the housing.

The ion implantation apparatus according to the present invention may further comprise a dose amount measurement portion for measuring a dose amount to the wafer by incidence of the ion beam, a determination portion for determining whether the measured dose amount is proper or not, and a control portion for carrying out the temporary evacuating operation of the ion beam by the deflecting apparatus when the measured dose amount is determined to be improper in implanting the ion.

The ion implantation apparatus according to the present invention may still further comprises a recordation portion for storing position information of the wafer when the dose amount is determined to be improper, and a wafer evacuating portion for evacuating the wafer to outside of a region of irradiating the ion beam. In this case, the control portion recovers the ion beam onto the beam trajectory line by stopping the temporarily evacuating operation when the predetermined time period has elapsed, and when the dose amount measured again by the dose amount measurement portion is determined to be proper by the determination portion, the control portion executes again the temporary evacuating operation and the wafer evacuating portion recovers the wafer to a position stored to the recordation means, successively, the control portion restarts to irradiate the ion beam from the stored position by stopping the temporarily evacuating operation.

By such a constitution and an operation, when the dose amount is determined to be improper, position information of the wafer is stored, and therefore, even in a case in which the wafer is evacuated from a position of implanting the ion when the discharge phenomenon is assumedly brought about, when it is determined that the dose amount is proper after a predetermined time period, the wafer can be recovered to a position before being evacuated based on the stored position information. Therefore, even when the discharge phenomenon is brought about in the mid-course of implanting the ions, the ion implantation can be restarted from the implanting position when the discharge phenomenon has been brought about.

In the ion implantation apparatus according to the present invention, an injector flag Faraday cup may be arranged to be able to be brought in and out to and from the beam line on an upstream side of the beam scanner. In this case, when the remeasured dose amount is determined to be improper, the injector flag Faraday cup is inserted to the beam line and the temporary evacuating operation is released by the control means.

An ion implantation method according to another aspect of the present invention is of implanting an ion by irradiating an ion beam extracted from an ion source to a wafer by way of a mass analysis magnet apparatus and a mass analysis slit arranged on a downstream side thereof. The ion implantation method, when a bad condition is brought about at the ion beam, on the beam line zone between the mass analysis magnet apparatus and the mass analysis slit or on a rear side of the mass analysis slit, executes the temporary evacuating operation of the ion beam by deflecting the ion beam in a predetermined direction of being deviated from the beam trajectory line with an operation of an electric field, and by maintaining the deflection for a predetermined time period, thereby the ion beam being not irradiated to the wafer for the predetermined time period.

In the ion implantation method according to the present invention, a downstream side of the mass analysis slit may be arranged with a beam scanner for reciprocally scanning the ion beam periodically in a horizontal direction or a specific direction other than the horizontal direction. In this case, a dose amount of the wafer is measured in implanting the ion and it is determined whether the measured dose amount is proper, and when the measured dose amount is determined to be improper, the temporary evacuating operation is executed.

In the ion implantation method according to the present invention, when the dose amount is determined to be improper, in addition to the temporary evacuating operation, position information of the wafer when the dose amount is determined to be improper may be stored, and the wafer may be evacuated to outside of a region of irradiating the ion beam. In this case, when the predetermined time period has elapsed, the ion beam is recovered to the beam trajectory line by stopping the temporary evacuating operation, the dose amount is remeasured and it is determined whether the dose amount is proper, and when it is determined that the remeasured dose amount is proper, the temporary evacuating operation is executed again, the wafer is returned to the stored position, thereafter, the temporary evacuating operation is stopped and the ion beam is restarted to be irradiated from the stored position.

In the ion implantation method according to the present invention, it is desirable that an injector flag Faraday cup is made to be able to be brought in and out to and from the beam line on an upstream side of the beam scanner. In this case, when it is determined that the remeasured dose amount is improper, the injector flag Faraday cup is inserted to the beam line and the temporary evacuating operation is released.

According to the present invention, the high speed evacuating and temporary evacuating of the ion beam can be realized regardless of a beam diameter or a beam sectional shape of the ion beam without effecting an influence on a peripheral member on the beam line.

BRIEF DESCRIPTION OF THE DRAWINGS

FIG. 2A is a plane view schematically showing a constitution when the present invention is applied to an ion implantation apparatus of a single wafer type;

FIG. 2B is a view schematically showing the ion implantation apparatus shown in FIG. 2A from a side face thereof;

DETAILED DESCRIPTION OF THE EXEMPLARY EMBODIMENTS

Figure 1:
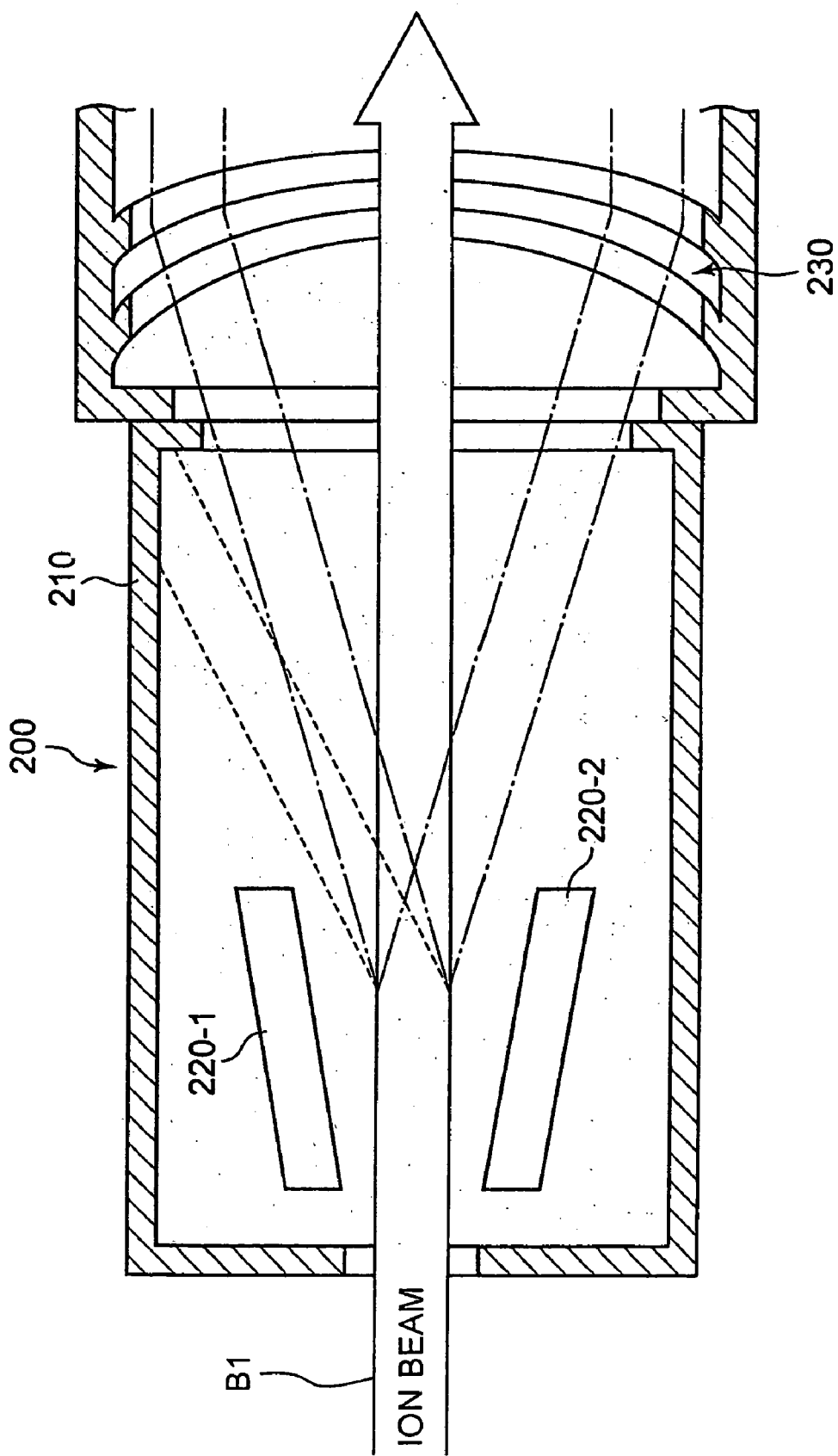
FIG. 1 is a plane sectional view for explaining of evacuating an ion beam carried out by a beam scanner in an ion implantation apparatus of a related art.

An embodiment of an ion implantation apparatus according to the present invention will be explained in reference to the drawings as follows. FIG. 2A and FIG. 2B are schematic views when the present invention is applied to an ion implantation apparatus of a single wafer type, particularly, FIG. 2A is a plane view and FIG. 2B is a side view. A constitution of the ion implantation apparatus 1 will be explained from the most upstream side of a beam line constituting a start point by an ion source 10. An outlet side of the ion source 10 is provided with an extracting electrode 12 for extracting an ion beam from a plasma generated at inside of an ion chamber. A vicinity of a downstream side of the extracting electrode 12 is provided with a suppression electrode 14 for restraining an electron included in the ion beam extracted from the extracting electrode 12 from flowing back to the extracting electrode 12. The ion source 10 is connected with an ion source high voltage power source 16 and an extracting power source 20 is connected to between the extracting electrode 12 and a terminal 18.

A downstream side of the extracting electrode 12 is arranged with a mass analysis magnet apparatus 22 for extracting an ion beam comprising a desired ion by separating an ion other than the desired ion from an incident ion beam. A downstream side of the mass analysis magnet apparatus 22 is arranged with a first quadrupole vertically focusing electromagnet 24 for focusing or converging an ion beam in a longitudinal (vertical) direction, a park electrode 26 for deflecting an ion beam from a beam trajectory line, a mass analysis slit 28 for passing an ion beam comprising an ion of a desired mass in the ion beam, and a second quadrupole vertically focusing electromagnet 30 for focusing or converging an ion beam in a longitudinal direction. The park electrode 26 and the mass analysis slit 28 are contained in a park housing 27 constituted by a material in which cross contamination of aluminum or the like is hardly present. Further, as the mass analysis slit 28, other than an exclusive slit of a fixed type, a plurality of stages of switching type mass analysis slits may be used. According to the plurality of stages of the switching type mass analysis slits, three stages of slit sizes of, for example, an elliptical/or an oval type slit for high beam current, a long and narrow circular slit for a low beam current, and an extremely small diameter slit for confirming a beam trajectory axis are mechanically switched.

A downstream side of the second quadrupole vertically focusing electromagnet 30 is arranged with an injector flag Faraday cup 32 for shutting off an ion beam as necessary and measuring a beam current, and a beam scanner 36 for periodically reciprocating to scan the ion beam in a horizontal direction orthogonal to a direction of advancing the ion beam. An upstream side and a downstream side of the beam scanner 36 are respectively provided with scanner suppression electrodes 34 and 38 having openings capable of restricting also a size of a sectional size of the ion beam, restraining diversion of the ion beam and shielding a scanning electric field from a surrounding. Further, the injector flag Faraday cup 32 is made to be able to be inserted and taken out to and from the beam line by a drive mechanism in an up and down direction in this case as explained later. Further, the injector flag Faraday cup 32, the beam scanner 36 and the scanner suppression electrodes 34 and 38 are contained in a scanner housing 37 made of aluminum.

Respective members on the beam line from the extracting electrode 12 to the scanner housing 37 are contained in the terminal 18. The terminal 18 is connected with a terminal power source 19. Therefore, potentials of the park housing 27 and the scanner housing 37 are the same as a potential of the terminal 18 to constitute the potential of the terminal power source 19.

A downstream side of the beam scanner 36 is arranged with a parallel lens 40 for redeflecting an ion beam deflected to have an angle in a horizontal direction relative to a center trajectory (center trajectory of ion beam before being scanned by the beam scanner 36) to be in parallel with the center trajectory, and an accelerating/decelerating column 42 for accelerating or decelerating the ion beam. The parallel lens 40 is constituted by a plurality of electrodes in a circular arc shape bored with holes for passing the ion beam at centers thereof. A first electrode from an upstream side of the parallel lens 40 is maintained at the terminal potential. A second electrode is referred to as a suppression electrode for restraining an electron from flowing in by being connected with the suppression power source 44. A third electrode is connected with a parallel lens power source 46, thereby, an electric field is generated between the second electrode and the third electrode, and an ion beam deflected in a horizontal direction becomes an ion beam in parallel with a center trajectory before being deflected. The parallel lens 40 is constructed by a structure of utilizing the electric field and the ion beam is decelerated by a potential difference between the second electrode and the third electrode. That is, the ion beam deflected by the beam scanner 36 is corrected in a trajectory thereof in a direction in parallel with a center trajectory before being deflected by the electric field between the second electrode and the third electrode and decelerated.

The accelerating/decelerating column 42 is constituted by one or more of electrodes in a linear shape. A first electrode from an upstream side of the accelerating/decelerating column 42 is connected with the parallel lens power source 46 similar to the third electrode of the parallel lens 40. Second and third electrodes are respectively connected with a first accelerating/decelerating column power source 48 and a second accelerating/decelerating column power source 50. The ion beam is accelerated or decelerated by adjusting voltages of the power sources. Further, a fourth electrode is grounded to a ground potential. A downstream side of the accelerating/decelerating column 42 is arranged with an angular energy filter (hereinafter, referred to as AEF) 52 of a hybrid type. AEF 62 is an energy filter for selecting the ion beam achieving an aimed acceleration energy. AEF 52 includes a magnetic deflecting electromagnet for magnetic field deflection and a static deflecting electrode for static deflection. The magnetic deflecting electromagnet is arranged to surround an AEF chamber 54 and is constituted by a yoke member surrounding upper and lower and left and right sides of the AEF chamber 54 and a group of coils wound around the yoke member. Further, the magnetic deflecting electromagnet is connected with a direct current voltage power source (not illustrated).

On the other hand, the static deflecting electrode is constituted by a pair of upper and lower AEF electrodes 56 and arranged to interpose an ion beam from up and down directions. In the pair of AEF electrodes 56, the AEF electrode 56 on an upper side is applied with a positive voltage and the AEF electrode 56 on a lower side is applied with a negative voltage, respectively. In deflecting by a magnetic field, an ion beam is deflected to a lower side by about 20 degrees by the magnetic field from the magnetic deflecting electromagnet and only an ion beam of an aimed energy is selected. On the other hand, in deflecting by the magnetic field and the electric field, or only the electric field, the ion beam is deflected to the lower side by about 20 degrees by a combining operation by the magnetic field from the magnetic deflecting electromagnet and the electric field generated between the pair of AEF electrodes 56, or a deflecting operation of the electric field and only an ion beam of an aimed energy is selected.

In this way, AEF 52 is of the hybrid type using the magnetic field, the electric field, and both of the magnetic field and the electric field as necessary, and therefore, in transporting a low energy beam, the magnetic field having a high electron confining effect can mainly be used and in transporting a high energy beam, in addition to using both of the magnetic field deflection and the static deflection, a deflecting operation of only the electric field can be used. Further, a way of use differs by an energy or a kind of a gas of the ion source 10 when the magnetic field is always used, or when both of the magnetic field and the electric field is used or the deflecting operation of only the electric field is used.

AEF 52 is provided with an AEF plasma shower 60 for promoting an efficiency of transporting an ion beam to a wafer 58 by restraining diversion of the ion beam by supplying an electron. Further, AEF 52 is respectively provided with AEF suppression electrodes 62 and 64 on an upstream side and a downstream side of the AEF plasma shower 60. The AEF suppression electrodes 62 and 64 mainly serve to restrict an electron barrier and a size of a sectional shape of the ion beam.

A wall of the AEF chamber 54 is arranged with a plurality of permanent magnets 66 for forming a cusp magnetic field. By forming the cusp magnetic field, an electron is confined to inside of the AEF chamber 54. The respective permanent magnets 66 are arranged such that magnetic poles thereof are directed to inside of the AEF chamber 54 and the contiguous magnetic poles have opposite magnetic poles. Further, an outlet side of the AEF chamber 54 is provided with a striker plate 68 for receiving a neutral particle or the like constituted by neutralizing an ion advancing straight without being deflected by AEF 52.

A processing chamber (vacuum processing chamber) 70 is connected with the AEF chamber 54. Selectable energy slits (hereinafter, referred to as SES) 72 are arranged at inside of the processing chamber 70. The selectable energy slits 72 are arranged to interpose the ion beam from up and down directions. Upper and lower selectable slits each includes 4 of slit faces, after selecting the slit face, by further adjusting axes of the upper and lower selectable slits in the up and down direction, and rotating the axes, a desired slit width is provided. By successively selecting 4 of the silt faces in accordance with a species of an ion, cross contamination is reduced.

A plasma shower 74 supplies a low energy electron to a front face of the wafer 58 along with the ion beam, neutralizes and restrains charge up of a positive charge produced by ion implanting. Dose cups 76 respectively arranged at left and right ends of the plasma shower 74 measure a dose amount. Specifically, the dose cup is connected with a current measurement circuit and the dose amount is measured by measuring a beam current which flows by making the ion beam incident thereon.

A beam profiler 78 includes a beam profiler cup (not illustrated) for measuring the beam current at an ion implanting position and a vertical profile cup (not illustrated) for measuring a beam shape and a beam X-Y position. The beam profiler 78 measures an ion beam density at the ion implanting position while being moved in a horizontal direction before implanting an ion or the like. When a predicted non uniformity (PNU) of the ion beam does not satisfy a request of the process as a result of measuring the beam profile, an applied voltage or the like of the beam scanner 36 is automatically adjusted to satisfy a process condition. The vertical profiler cup confirms a beam width and a beam center position by measuring the beam shape at the ion implanting position.

The most downstream side of the beam line is arranged with a triple surface beam dump (TSBD) 80 having a beam current measurement function similar to that of a Faraday cup for measuring a final setup beam. The triple surface beam dump 80 reduces cross contamination by switching three faces of a triangular pillar in accordance with a kind of a gas of the ion source 10. Further, the beam line is naturally maintained in high vacuum.

Figure 3:
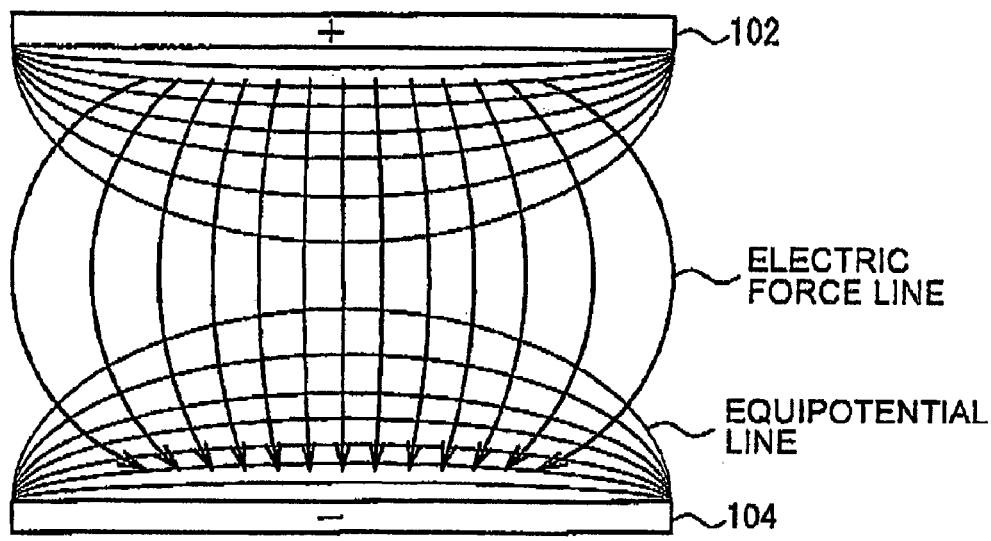
FIG. 3 is a view for explaining a principle of a park electrode used in the present invention.

FIG. 3 is a view for explaining a principle of a deflecting apparatus arranged at a beam line section from an outlet of the mass analysis magnet apparatus 22 to before the mass analysis slit 28 constituting one of characteristic portions according to the embodiment. Although the deflecting apparatus used in the embodiment may use either of deflection by the electric field and deflection by the magnetic field, in the following, an explanation will be given of a deflecting apparatus according to an electric field system using a park electrode comprising a pair of electrodes.

As shown by FIG. 3, the park electrode is constituted by a pair of electrodes 102 and 104 arranged at upper and lower sides to interpose the ion beam from up and down directions. As explained in FIG. 2A and FIG. 2B, the potential of the park housing 27 is the same as the potential of the terminal 18, and according to the park electrode at the terminal potential, the electrode 102 on the upper side is applied with null voltage (or applied with positive voltage), and therefore, the electrode is referred to as a plus electrode, and the electrode 104 on the lower side is applied with a negative voltage, and therefore, the electrode 104 is referred to as a minus electrode. When the plus electrode 102 is applied with null voltage (or applied with positive voltage) and the minus electrode 104 is applied with the negative voltage, equipotential lines constituted by continuously connecting points having the same potentials respectively are provided between both end portions of the plus electrode 102 and both end portions of the minus electrode 104. There can be provided a line of an electric force indicating a direction of an electric field orthogonal to the equipotential lines and directed from the plus electrode 102 to the minus electrode 104. However, in FIG. 3, the equipotential line and the line of the electric force are drawn exaggeratedly to facilitate understanding. Further, when the park housing 27 is arranged at outside of the terminal 18, the potential of the park housing 27 is set arbitrarily to the ground potential.

Figure 4:
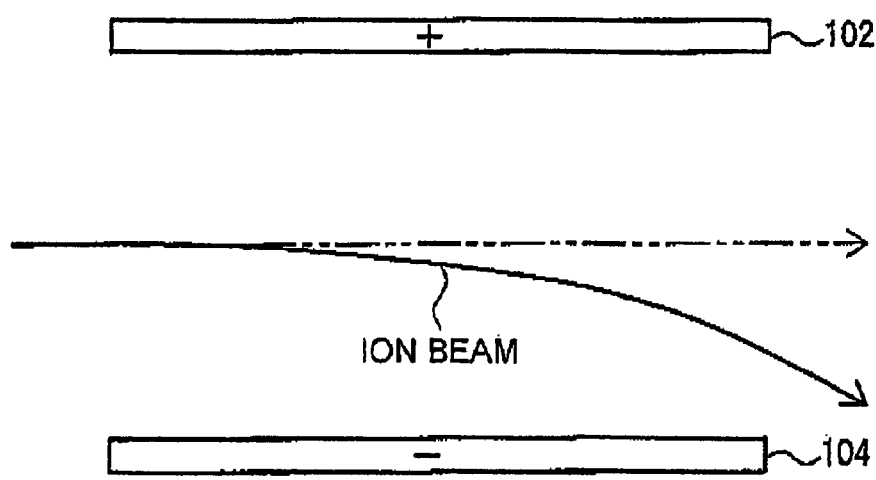
FIG. 4 is a side view for explaining a behavior when an ion beam passes through the park electrode shown in FIG. 3.

FIG. 4 is a side view showing a behavior when the ion beam passes between the plus electrode 102 and the minus electrode 104. When as shown by FIG. 4, the upper side electrode is maintained at null potential (or applied with positive predetermined voltage) and the lower side electrode is applied with a negative predetermined voltage, an electric field directed from the plus electrode 102 to the minus electrode 104 is generated between the plus electrode 102 and the minus electrode 104. Therefrom, when the ion beam passes between the two electrodes, the ion beam is deflected to a lower side from the beam trajectory line (indicated by a two-dotted chain line) to the minus electrode 104 by the electric field.

The ion beam is deflected to a lower side from the beam trajectory line by the electric field in this way, and therefore, it is necessary to determine a distance of separating the two electrodes by predicting an angle (or a distance) of being deflected to a lower side. However, in a case in which a potential difference between the two electrodes is constant, when the distance of separating the two electrodes is prolonged, a field strength is weakened. Hence, according to the present invention, there is adopted a constitution of expanding an interval between the two electrodes by bending one of the electrodes in the midway along a direction of advancing the ion beam by predicting an angle (or distance) of deflecting the ion beam.

In the constitution of applying the negative voltage to the minus electrode 104 by making the plus electrode 102 at null voltage, that is, the terminal potential, in comparison with the constitution of applying a positive voltage to the plus electrode 102, a secondary electron is not attracted to the plus electrode 102, and therefore, a possibility that a current flows in the plus electrode 102 by the secondary electron can be restrained. On the other hand, according to the constitution of further applying the positive voltage to the plus electrode 102 by constituting a reference by the potential of the terminal power source 38 and applying the negative voltage to the minus electrode 104, although a force of deflecting the ion beam is large, there is a possibility that a secondary electron generated by impinging on a wall face or the like at inside of the park housing 27 is attached by the plus electrode 102 and a current flows in the plus electrode 102. Further, in the latter constitution, there are needed both of a positive voltage power source applied to the plus electrode 102 and a negative voltage power source applied to the minus electrode 104. However, in the former constitution, the potentials of the park housing 27 and the plus electrode 102 are the same, and therefore, by only preparing the negative voltage power source applied to the minus electrode 104, the power source of the park electrode can be ensured. Therefore, the former constitution can be regarded to be a constitution more advantageous than the latter constitution from a view point of ensuring the power source and also a view point of ensuring insulation between different potentials.

Figure 5A:
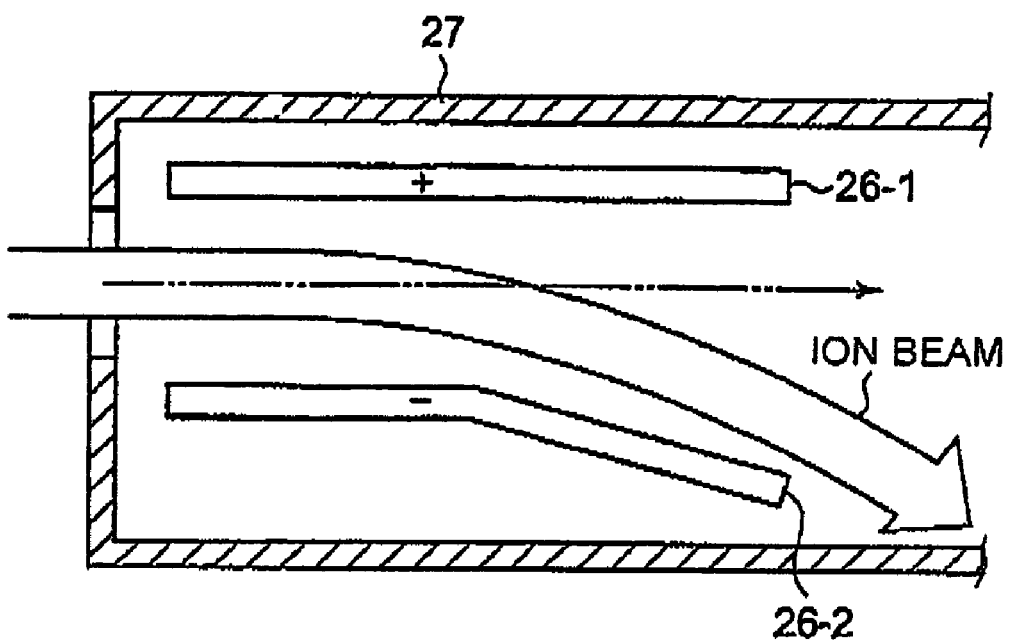
FIG. 5A is a vertical sectional view showing the park electrode according to the present invention.
Figure 5B:
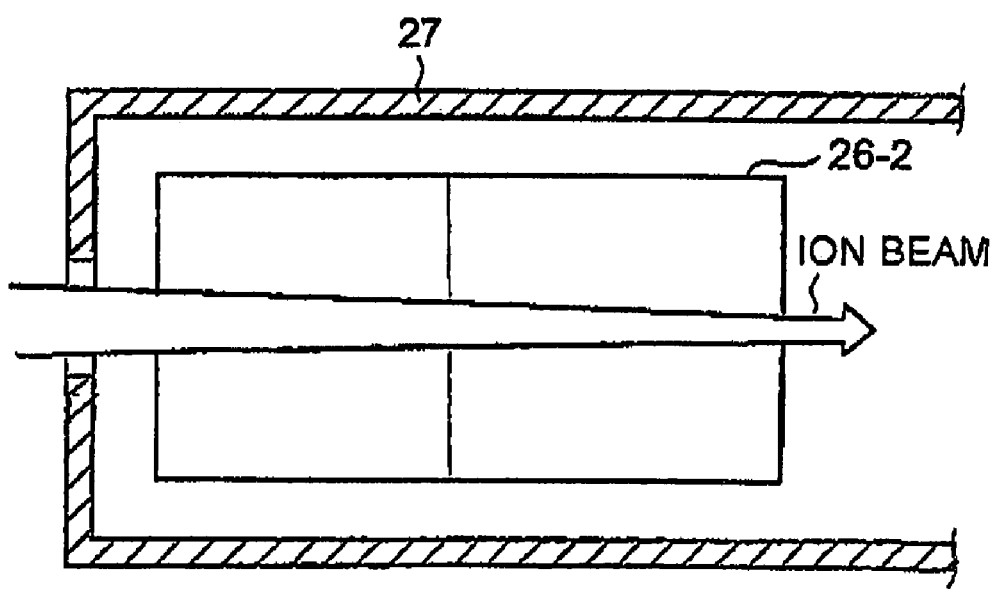
FIG. 5B is a cross-sectional view of FIG. 5A.

FIG. 5A and FIG. 5B are a vertical sectional view and a cross-sectional view showing the park electrode operated as the deflecting apparatus according to the present invention. As shown by FIG. 5A, the park electrode 26 is constituted by a plus electrode 26-1 in correspondence with the plus electrode 102 and a minus electrode 26-2 in correspondence with the minus electrode 104. The plus electrode 26-1 is an electrode extended in a horizontal direction and the minus electrode 26-2 is extended along an advancing direction of the ion beam and is bent in a direction of being expanded from the plus electrode 26-1 from a midway thereof. Specifically, the minus electrode 26-2 is bent in a direction of being separated from the plus electrode 26-1 by a radius of curvature substantially the same as a radius of curvature of deflecting the ion beam. As a result thereof, even when the ion beam is deflected by the electric field generated by the park electrode 26, the ion beam does not impinge on the minus electrode 26-2. Further, FIG. 5B is a cross-sectional view of FIG. 5A, showing converging of the ion beam in the horizontal direction of the park electrode portion in a section of reaching the mass analysis slit 28 from the mass analysis magnet apparatus 22 shown in FIG. 2A.

Figure 6A:
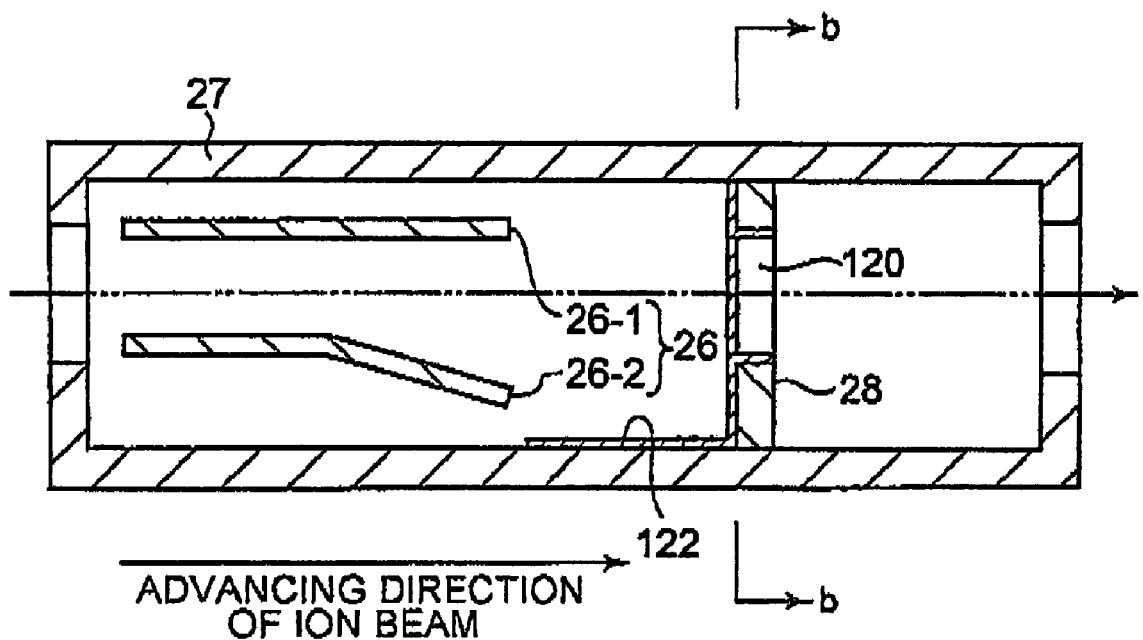
FIG. 6A is a side sectional view showing a park electrode (deflecting apparatus) and a mass analysis slit and a housing containing these constituting essential portions of the ion implantation apparatus according to the present invention.
Figure 6B:
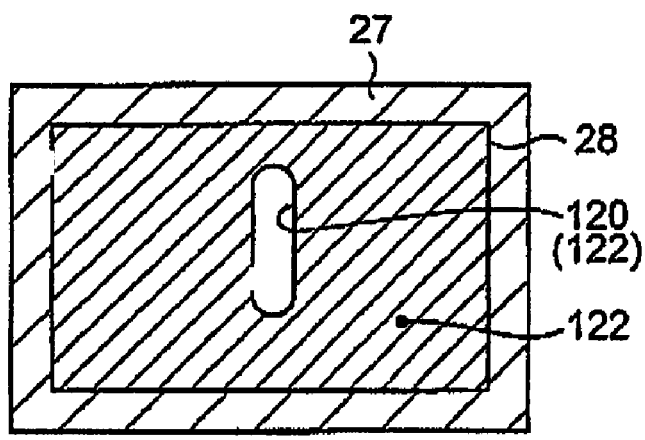
FIG. 6B is a front sectional view taken along a line b-b of FIG. 6A.

FIG. 6A is a vertical sectional view showing the park electrode and the mass analysis slit and the park housing containing these. In FIG. 6A, the park electrode 26 is arranged on a front side, that is, on the upstream side of the mass analysis slit 28 at the beam trajectory line indicated by a two-dotted chain line. The park electrode 26 and the mass analysis slit 28 are contained in the park housing 27 constituted by a material of aluminum or the like in which cross contamination is hardly present. FIG. 6B is a sectional view taken along a line b-b of FIG. 6A. As shown by FIG. 6B, a center of the mass analysis slit 28 is provided with a hole 120 for passing the ion beam comprising an ion of a predetermined mass in the ion beam. Further, a face on an upstream side of the mass analysis slit 28, a wall surface of the hole 120, an inner wall face of the park housing 27 in correspondence with a downstream side of the minus electrode 26-2 is covered by graphite (ion beam receiving member) 122. The graphite 122 is difficult to be sputtered and difficult to be exfoliated in comparison with aluminum or the like even when the ion beam impinges thereon. Further, graphite (allotrope of carbon) 122 is a congener element when the wafer 58 is a silicon wafer, and therefore, even when particles of the graphite 122 are implanted accidentally to the wafer 58, an influence thereof effected on a wafer characteristic is extremely small. Further, in a case in which a wall of the graphite 122 is not provided, when a time period during which an evacuated ion beam impinges on the park housing 27 is long, a surface of sputtered aluminum is considerably changed, and therefore, it is necessary to minimize a time period of temporarily evacuating the ion beam.

Figure 7A:
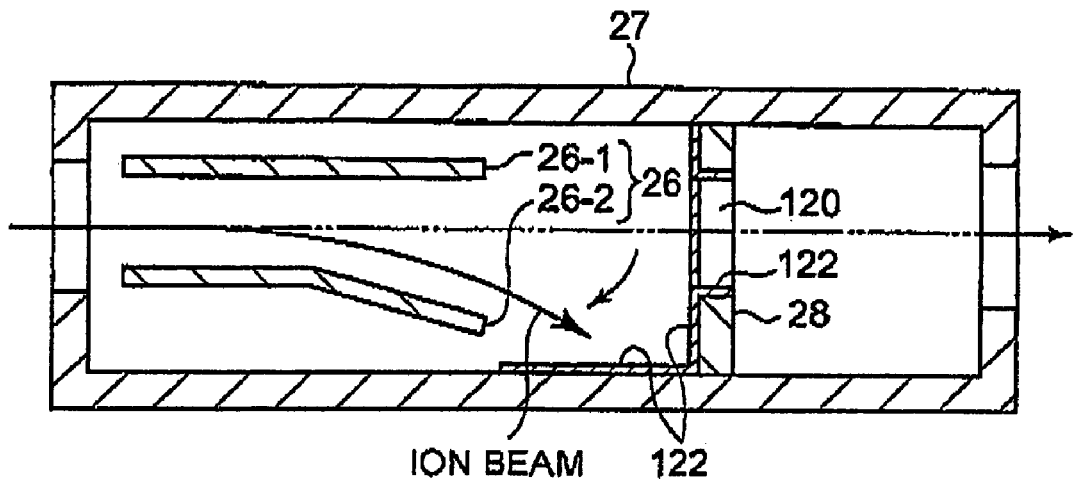
FIG. 7A is a side sectional view for explaining a behavior when an ion beam passes through a park electrode in a case in which an electric field is not present at the park electrode and in a case in which the electric field is present at the park electrode.

In FIG. 7A, when a park voltage is not applied to the park electrode 26 and there is not a potential difference between the plus electrode 26-1 and the minus electrode 26-2 and the electric field is not present at the park electrode 26, the ion beam from the mass analysis magnet apparatus 22 passes the park electrode 26 along the beam trajectory line. Among the ion beam having passed the park electrode 26, the ion beam composed of ions of a predetermined mass passes the hole 120 of the mass analysis slit 28. The ion beam passing the hole 120 of the mass analysis slit 28 advances to the beam scanner 36 disposed on the downstream side (refer to FIG. 2A).

On the other hand, when the electric field is present at the park electrode 26 comprising the plus electrode 26-1 and the minus electrode 26-2 by applying the park voltage, the ion beam from the mass analysis magnet apparatus 22 is deflected to a lower side to the side of the minus electrode 26-2 by the park electrode 26 as shown by a bold line in FIG. 7A. In a case of an extracting voltage equal to or higher than several tens kV at the ion source 10, a voltage applied to the minus electrode 26-2 is preferably around 10% thereof. Evacuating of the ion beam by such a deflection is much faster (microsecond order) than that of a deflection which is carried out mechanically, and is referred to as high speed evacuating. The deflected ion beam maintains a state of impinging on a face on the upstream side of the mass analysis slit 28 or impinging on the graphite 122 of the inner wall of the park housing 27. The state normally continues for a short period of time of about several seconds and is referred to as temporary evacuating of the ion beam. When the potential difference is nullified by making the power source applied to the park electrode 26 off in such a state, there is brought about a state in which the electric field is not present at the park electrode 26, and the deflected ion beam recovers to be along the beam trajectory line indicated by a two-dotted chain line in FIG. 7A. Thereby, an ion beam comprising an ion of a predetermined mass in the ion beam passing the park electrode 26 passes the hole 120 of the mass analysis slit 28. Further, the ion beam passing the hole 120 of the mass analysis slit 28 advances to the beam scanner 36 arranged on the downstream side.

Figure 7B:
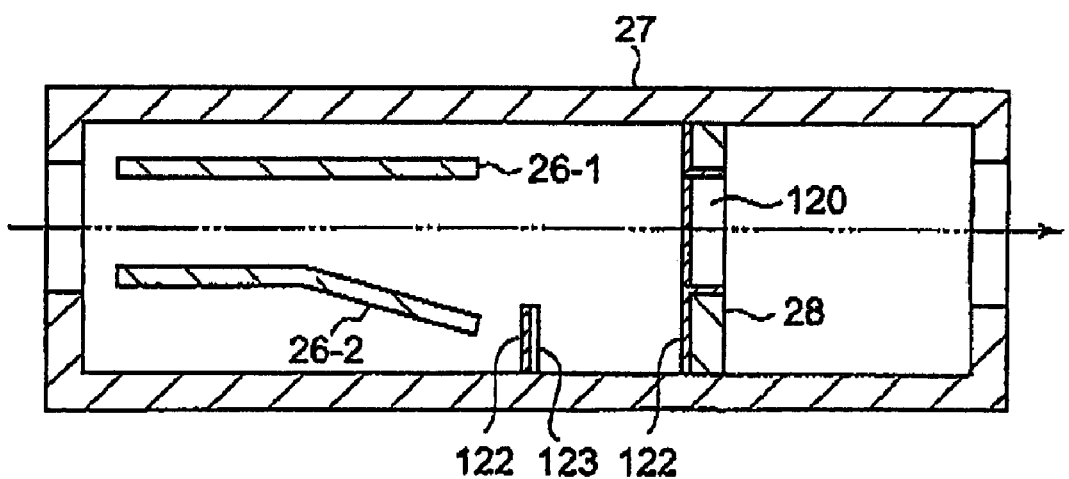
FIG. 7B is a side sectional view showing other example of a mass analysis slit and graphite provided at inside of a park housing.

FIG. 7B shows another example for eliminating an influence on a peripheral member when the ion beam is evacuated. According to the example, a beam impinging plate 123 is erected at an inner wall of the park housing 27 in correspondence with the downstream side of the minus electrode 26-2 to direct to the beam trajectory line side. Naturally, a height of the beam impinging plate 123 is constituted such that the ion beam does not impinge thereon in normal time. The beam impinging plate 123 is provided with the graphite 122 at a face on an upstream side thereof, and these may be realized by a single member of the graphite. When the ion beam is deflected for evacuating, the deflected ion beam is stopped by impinging on the graphite 122 of the beam impinging plate 123, and therefore, it is not necessary to provide the graphite 122 at the inner wall of the park housing 27 on a downstream side of the beam impinging plate 123.

In either of the examples of FIG. 7A and FIG. 7B, even when a sectional shape of the ion beam is any of a normal circular shape, an elliptical or a flat shape prolonged in a lateral direction or in the longitudinal direction, the ion beam can excellently be evacuated at inside of the park housing 27 without being effected with an influence of the sectional shape. Further, a region on which the ion beam impinges brought into a temporary evacuating state is covered by the graphite member which is difficult to be sputtered by the ion beam, and therefore, an adverse influence of contamination or the like by a sputtered particle is not effected on the downstream side of the mass analysis slit 28.

Further, although as described above, the park electrode 26 is arranged at the beam line section from the outlet of the mass analysis magnet apparatus 22 to the front side of the mass analysis slit 28, an arranging position may be defined as follows. The ion beam is converged in one direction by the mass analysis magnet apparatus 22, and a size thereof in the lateral direction becomes minimum and a size thereof in the longitudinal direction becomes the maximum at a position of the quadrupole vertically focusing electromagnet 24. Further, the ion beam is converged in the longitudinal direction by the quadrupole vertically focusing electromagnet 24 and the size in the lateral direction becomes maximum and a size in the longitudinal direction becomes a minimum at the position of the quadrupole vertically focusing electromagnet 30. When the quadrupole vertically focusing electromagnets 24 and 30 are provided, it is preferable to arrange the park electrode 26 on the beam line constituting a middle state of converging and diverging of the ion beam.

Next, an explanation will be given of an operation when a desired ion beam cannot be provided by generating a discharge phenomenon at the ion implantation apparatus 1 constituted as described above, and a simple explanation will be given of ion implantation at normal time before the explanation.

Figure 8:
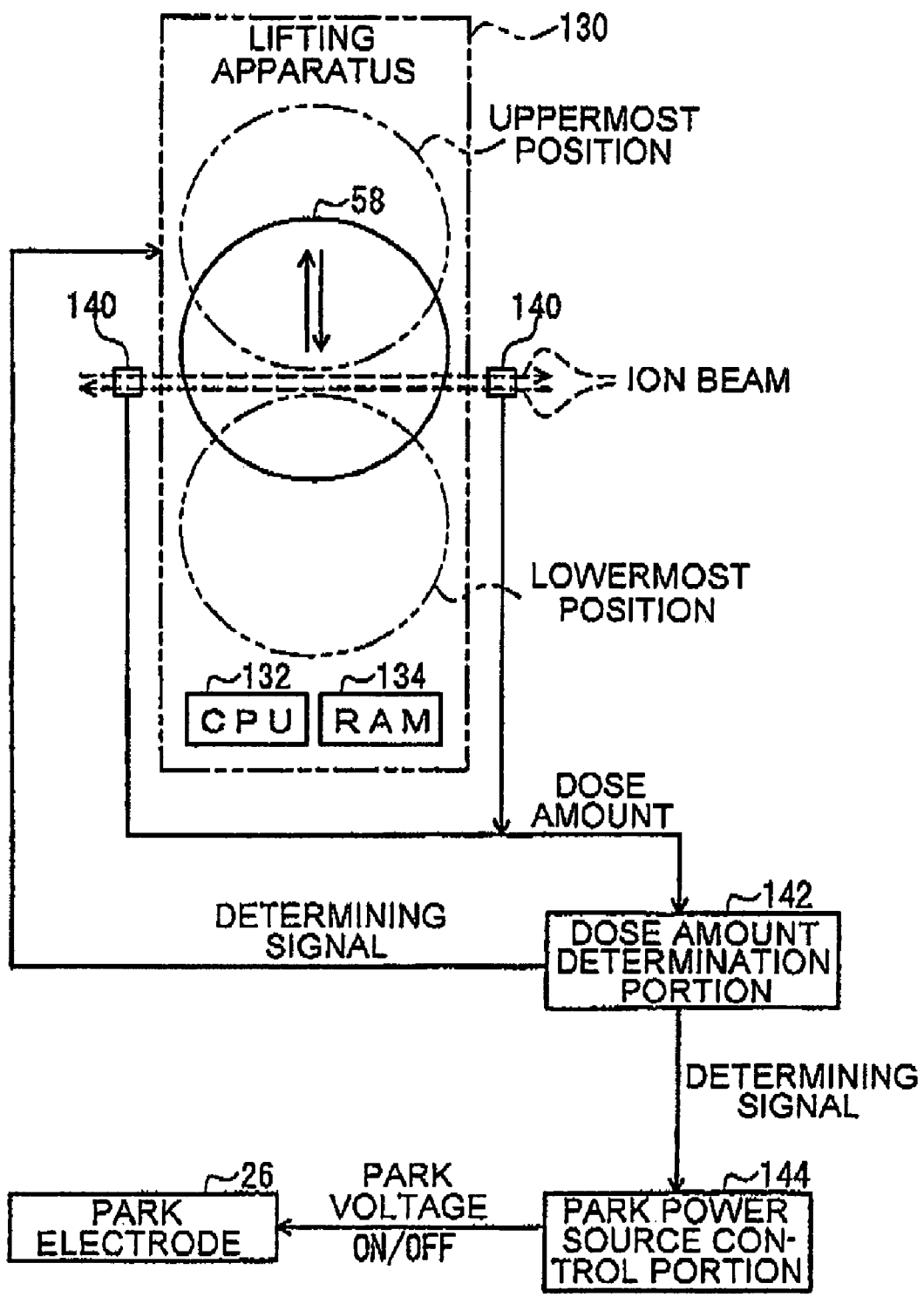
FIG. 8 is a view for explaining a behavior when ions are implanted to a wafer in a ion implantation apparatus according to the present invention.

FIG. 8 is an explanatory view showing a behavior when an ion is implanted to the wafer 58. As shown by FIG. 8, a lifting apparatus 130 includes a platen (not illustrated) for holding the wafer 58, and moves up and down the wafer 58 by moving up and down the platen in the up and down direction. Further, the lifting apparatus 130 includes CPU (Central Processing Unit) 132 for carrying out control and RAM (Random Access Memory) 134 for storing a position information in the up and down direction of the wafer 58, and stores the position information of the wafer 58 as necessary. A pair of dose cups 140 are arranged at fixed positions at inside of a region of irradiating the ion beam, in this case, left and right positions of the lifting apparatus 130 for measuring a dose amount and outputting a measured value. A dose amount determination portion 142 determines whether the dose amount is proper based on the measured values from the pair of dose cups 140 and outputs a result of determination as a determining signal. Specifically, when the dose amount is equal to or larger than a predetermined value, the dose amount determination portion 142 outputs a determining signal indicating that the dose amount is proper (hereinafter, referred to as proper determining signal). On the other hand, when the dose amount is less than the predetermined value, the dose amount determination portion 142 outputs a determining signal indicating that the does amount is improper (hereinafter, referred to as improper determining signal).

As indicated by an arrow mark of a broken line (arrow mark in lateral direction), the ion beam is reciprocally scanned to traverse the pair of dose cups 140 by the beam scanner 36. When the wafer 58 is moved in the up and down direction as indicated by an arrow mark of a bold line (arrow mark in up and down direction) relative to the ion beam reciprocally scanned in the horizontal direction, an entire face of the wafer 58 is scanned by the ion beam. As a result, the ion of the ion beam is implanted to an entire face of the wafer 58. Specifically, the ion is implanted to the entire face of the wafer 58 during a time period of moving the wafer 58 from a lowermost position to an uppermost position, or from the uppermost position to the lowermost position.

Meanwhile, in a case in which a desired ion beam cannot be provided by a discharge phenomenon when the ton is implanted to the wafer 58 in this way, the dose amount measured by the dose cup 140 is reduced. Further, when the dose amount becomes less than the predetermined value, the dose amount determination portion 142 outputs an improper determining signal. When the improper determining signal is received, a park power source control portion (control means) 144 controls the park voltage to be applied to the park electrode 26. When the park voltage is applied, the park electrode 26 evacuates the ion beam instantaneously by deflecting the ion beam to the lower side from the beam trajectory line and the state is maintained for a predetermined time (for example, 2 seconds). As a result, the ion beam impinges on the graphite 122 of the mass analysis slit 28, or the graphite 122 at inside of the park housing 27. Therefore, the mass analysis slit 28 or the park housing 27 can be utilized as an evacuating location. In addition thereto, the ion beam is deflected to the graphite 122 at inside of the mass analysis slit 28 of the park housing 27, and therefore, the ion beam does not arrive at the wafer 58 and is not implanted to the wafer 58.

Further, when the improper determining signal is received, CPU 132 of the lifting apparatus 130 stores information of the position in the up and down direction of the wafer 58 to RAM 134 and evacuates the wafer 58 to a position at which an ion is not implanted thereto (outside of region of irradiating ion beam) for caution's sake. Specifically, in a case in which a position of implanting an ion to the wafer 58 is an upper side than a center of the wafer 58 when the discharge phenomenon occurred, the wafer 58 is evacuated from the region of irradiating the ion beam by moving up the wafer 58 to the uppermost position. On the other hand, in a case in which the position of implanting the ion is a lower side than the center of the wafer 58 when the discharge phenomenon occurred, the wafer 58 is evacuated from the region of irradiating the ion beam by moving down the wafer 58 to the lowermost position. Therefrom, the lifting apparatus 130 and CPU 132 are operated as wafer evacuating means.

Successively, when it is determined that the wafer 58 is evacuated to the uppermost position or the lowermost position by an elapse of a predetermined time period after receiving the improper determining signal, the park power source control portion 144 stops supplying the park voltage to the park electrode 26. As a result, the ion beam brought into the evacuated state recovers instantaneously to the beam trajectory line. When the ion beam recovers to the beam trajectory line, the periodical reciprocal scanning is carried out by the beam scanner 36, and therefore, the dose amount of the ion beam is measured by the dose cups 140. When the dose amount is equal to or larger than the predetermined value as a result of the measurement, the dose amount determination portion 142 outputs the proper determining signal. When the proper determining signal is received, the park power source control portion 144 applies the park voltage to the park electrode 26. When the park voltage is applied, the park electrode 26 evacuates the ion beam by instantaneously deflecting the ion beam to the lower side of the beam trajectory line. Further, when the proper determining signal is received, CPU 132 reads information of the position of the wafer 58 from RAM 134 and recovers the wafer 58 to a position when the discharge phenomenon is detected, by driving the lifting apparatus 130.

Next, when it is determined that the predetermined time period has elapsed after receiving the proper determining signal and the wafer 58 is recovered to the position before evacuating (position when discharge phenomenon is detected), the park power source control portion 144 stops applying the park voltage to the park electrode 26. When the park voltage is stopped from being applied to the park electrode 26, the deflection of the ion beam is stopped and the ion beam instantaneously recovers to the beam trajectory line. As a result, the ion beam transmitting through the hole 120 of the mass analysis slit 28 advances to the beam scanner 36 and the ion beam is reciprocally scanned in the horizontal direction periodically by the beam scanner 36. At this occasion, the wafer 58 recovers to the position when the discharge phenomenon is detected, and therefore, ion implantation can be restarted from a midway position when ion implantation is interrupted. Therefore, even when the discharge phenomenon is brought about accidentally, so far as the phenomenon continues within the predetermined time period, it is not difficult to ensure the uniformity of the ion beam or makes the dose amount uniform and the ion can be implanted uniformly to the wafer 58.

Figure 9:
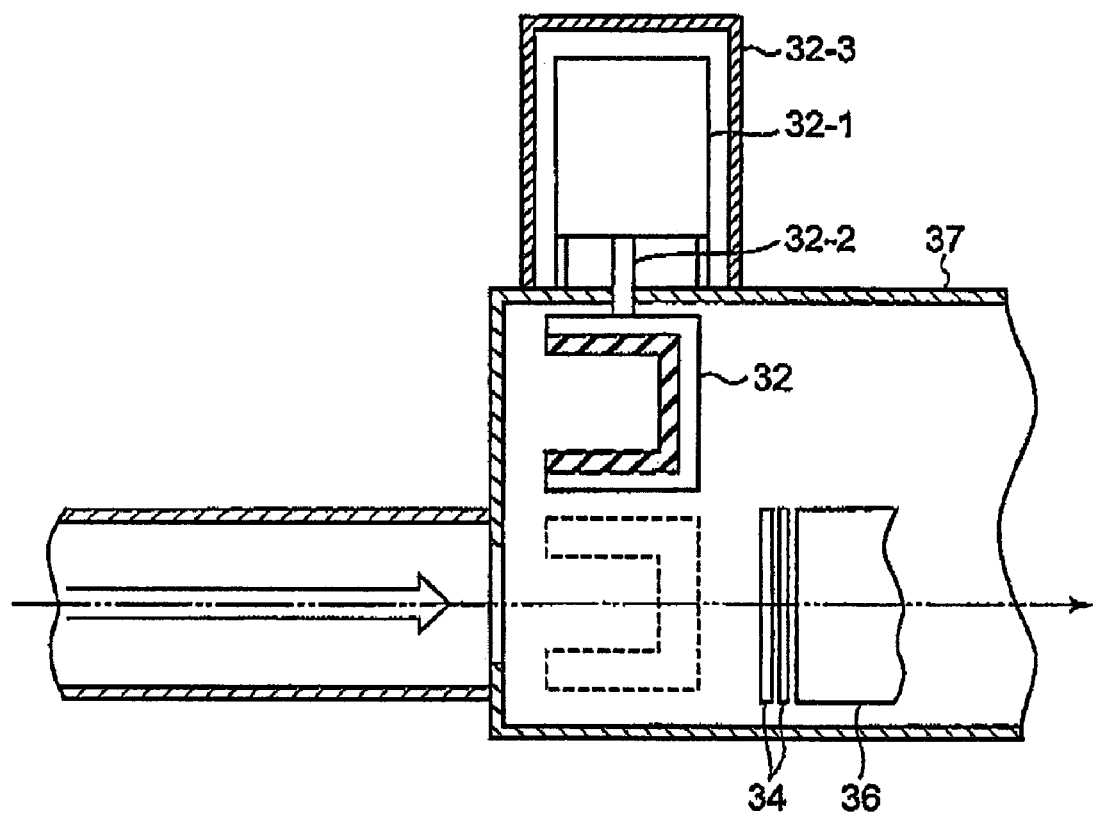
FIG. 9 is a sectional view for explaining an injector flag Faraday cup operated in cooperation with a temporary evacuating operation of an ion beam by a park electrode in the ion implantation apparatus according to the present invention.

FIG. 9 shows an outline of a mechanism of bringing the injector flag Faraday cup 32 in and out to and from the beam line. In this case, a drive mechanism 32-1 is provided above the scanner housing 37 in order to move the injector flag Faraday cup 32 upward and downward to be brought in and out from the beam trajectory line indicated by a two-dotted chain line in the drawing. A drive shaft 32-2 is introduced from the drive mechanism 32-1 into the scanner housing 37. A lower end of the drive shaft 32-2 is attached with the injector flag Faraday cup 32. In order to maintain a vacuum state (reduced pressure state) at inside of the scanner housing 37, the drive mechanism 32-1 is contained at inside of the housing 32-3 to be maintained in an airtight state and also a surrounding of the drive shaft 32-2 penetrating the scanner housing 37 is sealed.

Although the injector flag Faraday cup 32 is used for measuring the current of the ion beam and is normally present at an evacuating position indicated by a bold line in FIG. 9, the injector flag Faraday cup 32 is moved down in measurement to be placed on the beam trajectory line as shown by a broken line in the drawing.

By providing the injector flag Faraday cup 32 by the above-described constitution, when the predetermined time period (for example, 2 seconds) has elapsed after receiving the improper determining signal indicating that the dose amount is improper and the dose amount is measured again, in a case in which the proper determining signal indicating that the dose amount is proper cannot be received, the ion beam is shut off by the injector flag Faraday cup 32 by advancing the injector flag Faraday cup 32 onto the beam trajectory line at the scanner housing 37. Naturally, temporary evacuating of the ion beam is released. By such an operation, the graphite 122 provided at the mass analysis slit 28 or the park housing 27 can be restrained from being sputtered without prolonging the time period of evacuating the ion beam by the deflecting apparatus. A control of the drive mechanism 32-1 can be realized by the park power source control portion 144.

According to the embodiment as explained above, high speed evacuating and temporary evacuating of the ion beam can be realized without effecting an influence on the peripheral member without effecting an influence on the diameter or the sectional shape of the ion beam. Further, when a desired ion beam cannot be provided by combining dose amount measurement means, dose amount determination means, moving means (lifting means) as wafer evacuating means and CPU and RAM and park power source controlling means, by combining the temporal evacuating operation of the ion beam and the evacuating operation of the wafer, a nonuniform ion beam can be prevented from being irradiated to the wafer and the ion can be implanted uniformly always to the wafer.

Further, the above-described embodiment can also be realized by being modified as follows.

Although according to the above-described embodiment, the park electrode 26 is arranged between the mass analysis magnet apparatus 22 and the beam scanner 36, particularly at a middle position of an intermediate process of being directed from diverging to converging in the horizontal direction on the beam line, the park electrode 26 may be arranged at a middle position of an intermediate process directed from converging to diverging. On the other hand, according to an ion implantation apparatus which is not provided with the beam scanner 36, that is, an ion implantation apparatus of an ion beam fixed type, the park electrode 26 may be arranged between the mass analysis magnet apparatus 22 and the mass analysis slit 28, or on a rear side (downstream side) of the mass analysis slit 28.

Although according to the above-described embodiment, there is constructed a constitution of deflecting the ion beam in the lower direction by the electric field by the park electrode 26, there may be constructed a constitution of deflecting the ion beam in a direction other than the lower direction, for example, in an upper direction by the electric field of the park electrode 26. In this case, the graphite 122 is naturally provided at a portion at which the ion beam impinges on the park housing 27.

Although according to the above-described embodiment, there is constructed a constitution of reciprocally scanning the ion beam periodically in the direction orthogonal to the advancing direction of the ion beam, in place thereof, the present invention may be applied to an ion implantation apparatus of a constitution in which the ion beam is not reciprocally scanned.

Although in the above-described embodiment, there is constructed a constitution of reciprocally scanning the ion beam periodically in the horizontal direction orthogonal to the advancing direction of the ion beam, in place thereof, there may be constructed a constitution of reciprocally scanning the ion beam periodically in a specific direction other than the horizontal direction, for example, a vertical direction.

Although according to the above-described embodiment, there is constructed a constitution of storing the information of the position in the up and the down direction of the wafer 58 to RAM 134 by CPU 132 of the lifting apparatus 130 when the improper determining signal indicating that the dose amount is improper is received, there may be constructed a constitution of controlling the lifting apparatus 130 by storing the information of the position in the up and down direction of the wafer 58 to RAM 134 by CPU (not illustrated) for controlling an operation of the ion implantation apparatus 1.

Although according to the above-described embodiment, there is constructed a constitution of storing the information of the position in the up and down direction of the wafer 58 to RAM 134, there may be constructed a constitution of storing the information of the position of the wafer 58 (for example, position in the horizontal direction, up and down direction, inclination of wafer 58 or the like) to RAM 134.

Although according to the above-described embodiment, there is constructed a constitution of storing the information of the position in the up and down direction of the wafer 58 to RAM 134, there may be constructed a constitution of storing an ion implanting position as the position information, that is, a position at which the ion beam is implanted to the wafer 58 in a constitution in which the wafer 58 is not moved up and down and in the up and down direction, that is, in a constitution of scanning the ion beam from an upper end to a lower end of the wafer 58.

Although according to the above-described embodiment, the present invention is applied to the ion implantation apparatus of the single wafer type, in place thereof, the present invention may be applied to an ion implantation apparatus of a batch type.

What is claimed is:

1. An ion implantation apparatus including a beam line of implanting an ion by irradiating an ion beam extracted from an ion source to a wafer by way of a mass analysis magnet apparatus and a mass analysis slit arranged on a downstream side thereof, wherein the mass analysis apparatus is configured to separate an ion other than the desired ion from an incident ion beam, the ion beam being converged in the horizontal direction at the mass analysis slit and diverged after passing through the mass analysis slit, the ion implantation apparatus comprising:
    a deflecting apparatus arranged at a section of the beam line from an outlet of the mass analysis magnet apparatus to a front side of the mass analysis slit, for deflecting the ion beam in a vertical direction deviated from a beam trajectory line and to a lower side from the beam trajectory line by an operation of an electric field;
    wherein the deflecting apparatus is configured so as to carry out, a high speed evacuating operation of an ion beam evacuation from the beam trajectory line, and a temporary evacuating operation which comprises the high speed evacuating operation and a maintaining operation of an evacuated state for a predetermined time period; and
    wherein the ion implantation apparatus further comprises dose amount measurement means for measuring a dose amount into the wafer by incidence of the ion beam, determination means for determining whether the measured dose amount is proper or not, and control means for carrying out the temporary evacuating operation of the ion beam by the deflecting apparatus when the measured dose amount is determined to be improper in implanting the ion.

2. The ion implantation apparatus according to claim 1, further comprising:
    a beam scanner for reciprocally scanning the ion beam periodically in a horizontal direction or a specific direction other than the horizontal direction on a downstream side of the mass analysis slit.

3. The ion implantation apparatus according to claim 2, wherein on a front side of the beam scanner, the ion beam is diverged in the horizontal direction and converged in a vertical direction; and wherein the deflecting apparatus is arranged at a middle position, of an intermediate process of being directed from diverging to converging in the horizontal direction.

4. The ion implantation apparatus according to claim 1, wherein the deflecting apparatus includes a pair of deflecting electrodes arranged so as to oppose to each other by interposing the ion beam and extended in a direction of advancing the ion beam, one of the pair of deflecting electrodes is bent in a direction of being separated from other of the deflecting electrodes in the mid-course of the advancing direction of the ion beam, and the ion beam is deflected in the direction of being bent.

5. The ion implantation apparatus according to claim 4, wherein the pair of deflecting electrodes and the mass analysis slit are contained in a housing, and an ion beam receiving member comprises a material on which the ion beam deflected for evacuating impinges and by which sputtering is less generated by impacting the ion beam is provided at a face on an upstream side of the mass analysis slit and an inner wall of the housing.

6. The ion implantation apparatus according to claim 1, further comprising:
  recordation means for storing position information of the wafer when the dose amount is determined to be improper, and wafer evacuating means for evacuating the wafer to outside of a region of irradiating the ion beam;
  wherein the control means recovers the ion beam onto the beam trajectory line by stopping the temporarily evacuating operation when the predetermined time period has elapsed; and
  wherein when the dose amount measured again by the dose amount measurement means is determined to be proper by the determination means, the control means executes again the temporary evacuating operation and the wafer evacuating means recovers the wafer to a position stored to the recordation means, successively, the control means restarts to irradiate the ion beam from the stored position by stopping the temporarily evacuating operation.

7. The ion implantation apparatus according to claim 6, wherein an injector flag Faraday cup is arranged to be able to be brought in and out to and from the beam line on an upstream side of the beam scanner; and
  wherein when the remeasured dose amount is determined to be improper, the injector flag Faraday cup is inserted to the beam line and the temporary evacuating operation is released by the control means.

8. An ion implantation method of implanting an ion by irradiating an ion beam extracted from an ion source to a wafer by way of a mass analysis magnet apparatus and a mass analysis slit arranged on a downstream side thereof, a downstream side of the mass analysis slit being arranged with a beam scanner for reciprocally scanning the ion beam periodically in a horizontal direction or a specific direction other than the horizontal direction,
  wherein when a bad condition is brought about at the ion beam, the ion beam is deflected temporarily to a vertical direction being deviated from the beam trajectory line and to a lower side from the beam trajectory line with an operation of an electric field for a temporary evacuating operation, on the beam line zone between the mass analysis magnet apparatus and the mass analysis slit or the beam line zone after the mass analysis slit, and by maintaining the deflection of the ion beam for a predetermined time period, thereby the ion beam being not irradiated to the wafer for the predetermined time period, or when a dose amount of the wafer is measured in implanting the ion and it is determined whether the measured dose amount is proper, or when the measured dose amount is determined to be improper, also said temporary evacuating operation is executed.

9. The ion implantation method according to claim 8, wherein when the dose amount is determined to be improper, in addition to the temporary evacuating operation, position information of the wafer when the dose amount is determined to be improper is stored, and the wafer is evacuated to outside of a region of irradiating the ion beam;
  wherein when the predetermined time period has elapsed, the ion beam is recovered to the beam trajectory line by stopping the temporary evacuating operation, the dose amount is remeasured and it is determined whether the dose amount is proper; and
  when it is determined that the remeasured dose amount is proper, the temporary evacuating operation is executed again, the wafer is returned to the stored position, thereafter, the temporary evacuating operation is stopped and the ion beam is restarted to be irradiated from the stored position.

10. The ion implantation method according to claim 9, wherein an injector flag Faraday cup is made to be able to be brought in and out to and from the beam line on an upstream side of the beam scanner; and
  wherein when it is determined that the remeasured dose amount is improper, the injector flag Faraday cup is inserted to the beam line and the temporary evacuating operation is released.

* * * * *

UNITED STATES PATENT AND TRADEMARK OFFICE
CERTIFICATE OF CORRECTION

PATENT NO. : 7,851,772 B2
APPLICATION NO. : 12/100666
DATED : December 14, 2010
INVENTOR(S) : Mitsukuni Tsukihara et al.

It is certified that error appears in the above-identified patent and that said Letters Patent is hereby corrected as shown below:

Title Page:

In (73) Assignee, please correct the Assignee to read as follows:

(73) SEN Corporation, an SHI and Axcelis Company

Signed and Sealed this
Twenty-second Day of February, 2011

David J. Kappos
*Director of the United States Patent and Trademark Office*